US009490416B2

United States Patent
Koh et al.

(10) Patent No.: US 9,490,416 B2
(45) Date of Patent: Nov. 8, 2016

(54) PIEZOELECTRIC DRIVE CIRCUIT

(71) Applicant: Hyundai Dymos Incorporated, Chungcheongnam-do (KR)

(72) Inventors: Sang Kyung Koh, Gyeonggi-do (KR); Jong In Shin, Gyeonggi-do (KR); Sang June Lee, Gyeonggi-do (KR); Seong Youn Jo, Seoul (KR)

(73) Assignee: HYUNDAI DYMOS INCORPORATED, Chungcheongnam-Do (KR)

( * ) Notice: Subject to any disclaimer, the term of this patent is extended or adjusted under 35 U.S.C. 154(b) by 0 days.

(21) Appl. No.: 14/833,624

(22) Filed: Aug. 24, 2015

(65) Prior Publication Data

US 2016/0056733 A1 Feb. 25, 2016

(30) Foreign Application Priority Data

Aug. 25, 2014 (KR) ........................ 10-2014-0110554

(51) Int. Cl.
*H01L 41/00* (2013.01)
*H01L 41/04* (2006.01)

(52) U.S. Cl.
CPC .................................. *H01L 41/042* (2013.01)

(58) Field of Classification Search
CPC .................. H01L 41/042; H01L 2224/78347; H01L 2224/79347; H01L 2924/1426
See application file for complete search history.

(56) References Cited

U.S. PATENT DOCUMENTS

| 4,126,867 A | * | 11/1978 | Stevenson, Jr. | ...... B41J 2/04541 310/317 |
| 4,245,224 A | * | 1/1981 | Isayama | ................. B41J 2/1652 347/10 |
| 5,097,171 A | * | 3/1992 | Matsunaga | ........ B60G 17/0185 310/316.01 |

FOREIGN PATENT DOCUMENTS

| KR | 10-2003-0037622 | | 5/2003 |
| KR | 20030037622 A | * | 5/2003 |

OTHER PUBLICATIONS

Office Action issued on Feb. 29, 2016 for corresponding Korean Application No. 10-2014-0110554—4 pages.

\* cited by examiner

*Primary Examiner* — Eduardo Colon Santana
*Assistant Examiner* — Bickey Dhakal
(74) *Attorney, Agent, or Firm* — Brinks Gilson & Lione

(57) ABSTRACT

A piezoelectric drive circuit includes a first circuit which applies a voltage to the piezoelectric element and includes a plurality of transistors. A second circuit removes the residual current of the piezoelectric element and includes a plurality of transistors, and among the transistors included in the first circuit and the second circuit, transistors operated by an input signal are simultaneously turned ON/OFF by receiving the same input signal. Thus, when using a piezoelectric element as the air valve, it is possible to reduce leakage of air.

4 Claims, 1 Drawing Sheet

PIEZOELECTRIC DRIVE CIRCUIT

CROSS-REFERENCE TO RELATED APPLICATIONS

Figure 1:
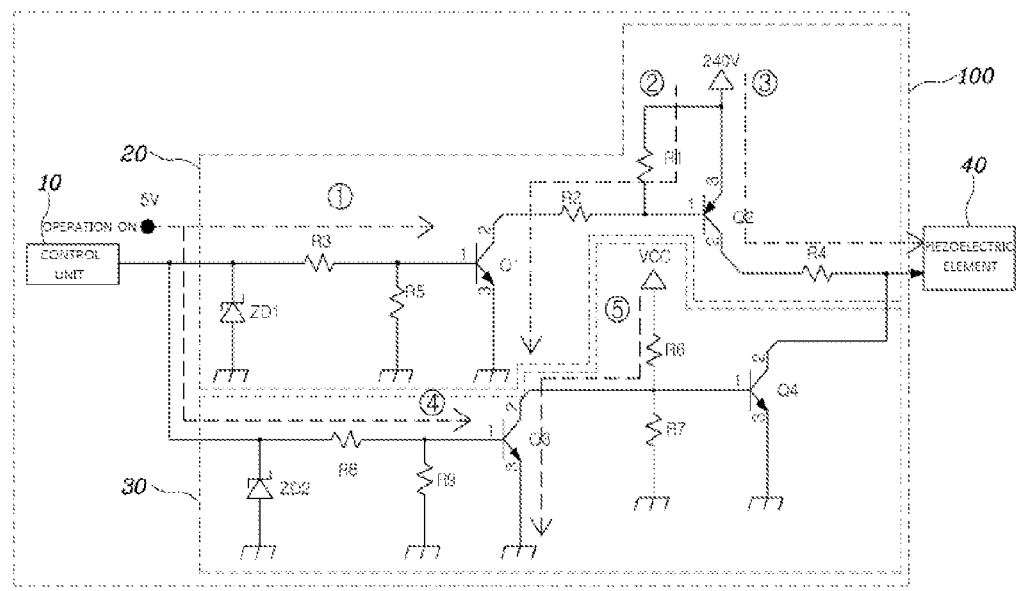

This application claims the benefit of Korean Patent Application No. 10-2014-0110554, filed on Aug. 25, 2014, the entire contents of which are incorporated herein by reference

FIELD

The present disclosure relates to a piezoelectric drive circuit for driving a piezoelectric element.

BACKGROUND

The statements in this section merely provide background information related to the present disclosure and may not constitute prior art.

A principle of piezoelectric is to utilize a piezoelectric effect and an inverse piezoelectric effect. The piezoelectric effect refers to generation of the voltage when applying a force to both ends of the piezoelectric. Products to which the piezoelectric effect is applied include a shock sensor, a knock sensor and the like. The inverse piezoelectric effect refers to a phenomenon in which displacement occurs when a voltage is applied to both ends of the piezoelectric. Products using this phenomenon include an injector, an actuator and the like. As an example, in the case of the piezoelectric actuator, the displacement occurs when a piezoelectric top plate is contracted by the reverse piezoelectric effect.

Related prior art discloses a piezoelectric circuit. According to the prior art, the piezoelectric circuit includes a sub-piezoelectric circuit, and an external inductor connected in parallel to the sub-piezoelectric circuit. The external inductor discharges the sub-piezoelectric circuit, when the polarity of the piezoelectric voltage which is both end voltages of the piezoelectric circuit is inverted. Here, the sub-piezoelectric circuit includes a series resonant circuit which has a first capacitor, a first inductor, and a resistance connected in series to one another, and a second capacitor connected in parallel to the series resonant circuit.

The piezoelectric element can be used as a valve which regulates the inflow and outflow of air by utilizing the piezoelectric effect of the piezoelectric element. That is, when the displacement occurs by contraction or expansion of the piezoelectric element, holes into which air flows can be generated or removed by utilizing the displacement.

However, when the current remains in the piezoelectric element, it is not possible to accurately achieve the functions of the air valve, and leakage of air may occur.

SUMMARY

The present disclosure provides a piezoelectric drive circuit which can substantially remove the current remaining in the piezoelectric element.

According to an aspect of the present disclosure, there is provided a piezoelectric drive circuit which applies a voltage to a piezoelectric element, and the piezoelectric drive circuit includes a first circuit which applies a voltage to the piezoelectric element and includes a plurality of transistors; and a second circuit which removes the residual current of the piezoelectric element and includes a plurality of transistors, wherein among transistors included in the first circuit and the second circuit, transistors operated by an input signal are simultaneously turned ON/OFF by receiving the same common input signal.

The piezoelectric drive circuit may further include a control unit that transmits an input signal to the first circuit and the second circuit.

The plurality of transistors included in the first circuit may include a first transistor which receives the input signal, and a second transistor connected to the piezoelectric element.

The plurality of transistors included in the second circuit may include a third transistor which receives the input signal, and a fourth transistor connected to the piezoelectric element.

When an ON-input signal is received by the first transistor, the first transistor is turned on, and when the first transistor is turned on, the second transistor may be turned on.

When an ON-input signal is received by the third transistor, the third transistor is turned on, and when the third transistor is turned on, the fourth transistor may be turned off.

On/off states of the second transistor and the fourth transistor may be opposite to each other.

The piezoelectric element may be connected to collector terminals of the second transistor and the fourth transistor.

When the second transistor is in an ON-state, current may be supplied to the piezoelectric element from the first circuit.

When the fourth transistor is in an ON-state, the current may be introduced into the second circuit side from the piezoelectric element.

Further areas of applicability will become apparent from the description provided herein. It should be understood that the description and specific examples are intended for purposes of illustration only and are not intended to limit the scope of the present disclosure.

DRAWINGS

Figure 2:
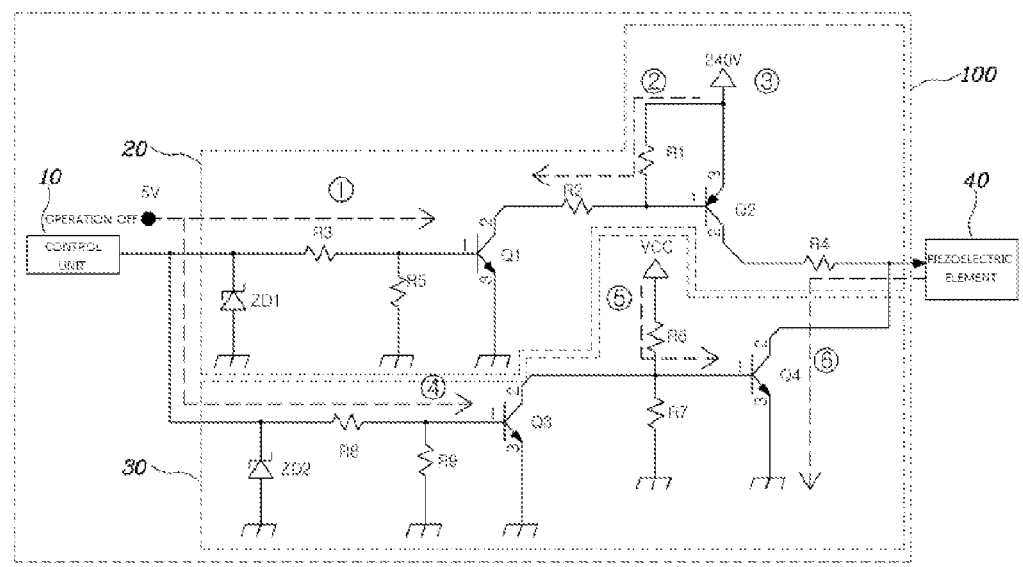

In order that the disclosure may be well understood, there will now be described various forms thereof, given by way of example, reference being made to the accompanying drawings, in which:

FIG. 1 is a circuit diagram illustrating the operation of a piezoelectric drive circuit according to one form of the present disclosure; and FIG. 2 is a circuit diagram illustrating the operation of a piezoelectric drive circuit according to one form of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Although terms such as first and/or second can be used to describe various components, the components should not be limited by the above-mentioned terms. The above-mentioned terms are only used to distinguish one element from the other element, for example, without departing from the scope of rights according to the concept of the present disclosure, the first component may be called a second component, and the second component may also be called a first component.

When it is described that a component is "connected" or "coupled" to another component, although a component may be directly connected or coupled to another component, it should be understood that other components may be present in the middle. Meanwhile, when it is described that a component is "directly connected" or "directly coupled" to another component, it should be understood that there is no other element in the middle. Other expressions describing the relationship between the components, i.e., "between~", "immediately between~" or "adjacent to" and "immediately adjacent to~" should also be similarly interpreted.

The terms used herein are simply used to describe certain forms and are not intended to limit the present disclosure. Unless otherwise defined, singular expression includes plural expressions. As used herein, terms such as "comprise" or "have" specify the presence of embodied features, numbers, steps, operations, elements, parts or a combination of them, and should be understood not to preclude presence or addition of one or more other features, numbers, steps, operations, components, parts or a combination of them.

FIGS. 1 and 2 are circuit diagrams illustrating the operation of the piezoelectric drive circuit according to one form of the present disclosure.

Specifically, FIG. 1 is a diagram showing a piezoelectric drive circuit 100 and a piezoelectric element 40 when an operation-on signal is transmitted to a first circuit 20 and a second circuit 30 by a control unit 10. Meanwhile, FIG. 2 is a diagram showing the piezoelectric element 40 and the piezoelectric drive circuit 100 when the operation-off signal is transmitted to the first circuit 20 and the second circuit 30 by the control unit 10.

The piezoelectric drive circuit 100 may include a first circuit 20 and a second circuit 30.

The first circuit 20 outputs the current to a first transistor Q1 connected to the control unit 10 and the piezoelectric element 40 so as to receive an operating signal from the control unit 10, and may include a second transistor Q2 having a base terminal to which a collector terminal of the first transistor Q1 is connected.

The second circuit 30 removes the current remaining in a third transistor Q3 connected to the control unit 10 and the piezoelectric element 40 so as to receive an operating signal from the control unit 10, and may include a fourth transistor Q4 having a base terminal to which a collector terminal of the third transistor Q3 is connected.

The control unit 10 is connected to the base terminal of the first transistor Q1 to be able to control ON/OFF of the first transistor Q1, and is connected to the base terminal of the third transistor Q3 to be able to control ON/OFF of the third transistor Q3. That is, among the transistors Q1, Q2, Q3, Q4 included in the first circuit and the second circuit, the transistors Q1, Q3 operated by the input signal of the control unit 10 may be simultaneously turned ON/OFF by receiving the same input signal from the control unit 10.

Specifically, when the ON-input signal for turning on the first transistor Q1 and the third transistor Q3 is received by the base terminals of the first transistor Q1 and the third transistor Q3 from the control unit 10, the first transistor Q1 and the second transistor Q2 are turned on, and when the OFF-input signal for turning off the first transistor Q1 and the third transistor Q3 is received by the base terminals of the first transistor Q1 and the third transistor Q3 from the control unit 10, the first transistor Q1 and the second transistor Q2 may be turned off.

The collector terminal of the first transistor Q1 is connected to the base terminal of the second transistor Q2, and an emitter terminal of the first transistor Q1 is connected to a ground. The collector terminal of the second transistor Q2 is connected to the piezoelectric element 40, and all the emitter terminal and the base terminal of the second transistor Q2 may be connected to an external high-voltage power supply.

When the ON-input signal from the control unit 10 is received, the first transistor Q1 is turned on, and thus, the current from an external high-voltage power supply connected to the emitter terminal and the base terminal of the second transistor Q2 enters the collector terminal of the first transistor Q1 and exits the emitter terminal thereof.

Thus, the voltage of the base terminal of the second transistor Q2 is higher than the voltage of the emitter terminal due to the resistance R1, and thus, the second transistor Q2 is turned on. As the second transistor Q2 is turned on, the current from the external power supply is supplied to the piezoelectric element 40, and the voltage is applied.

Meanwhile, in the second circuit 30, the collector terminal of the third transistor Q3 is connected to the base terminal of the fourth transistor Q4 and the external power supply, the collector terminal of the fourth transistor Q4 is connected to the piezoelectric element 40, and the emitter terminal of the fourth transistor Q4 is connected to the ground. The base terminal of the fourth transistor Q4 is connected to the collector terminal of the third transistor Q3 and the external power supply.

Upon examination of the operation of the second circuit 30 when the ON-input signal from the control unit 10 is received, the third transistor Q3 is turned on, and when the third transistor Q3 is turned on, the current from the external power supply flows to the emitter terminal from the collector terminal of the third transistor Q3. If the voltage of the collector terminal of the fourth transistor Q4 is higher than the voltage of the base terminal, the fourth transistor Q4 is turned off. Since the fourth transistor Q4 is turned off, the current does not flow from the piezoelectric element 40 to the second circuit 30.

Meanwhile, when the OFF-input signal from the control unit 10 is received, the first transistor Q1 is turned off, and thus, the second transistor Q2 is also turned off, and the current from the external high-voltage power supply is not supplied to the piezoelectric element 40.

Upon examination of the operation of the second circuit 30 when the OFF-input signal from the control unit 10 is received, the third transistor Q3 is turned off, and when the third transistor Q3 is turned off, the voltage of the collector terminal of the fourth transistor Q4 becomes lower than the voltage of the base terminal, and the fourth transistor Q4 is turned on. Since the fourth transistor Q4 is turned on, the current flows in the direction of the second circuit 30 from the piezoelectric element 40 and exits through the ground connected to the emitter terminal of the fourth transistor Q4. Therefore, when the current from the external high-voltage power supply does not flow in the piezoelectric element 40, the residual current of the piezoelectric element 40 may be removed.

As illustrated in the drawings, the first transistor Q1, the third transistor Q3, and the fourth transistor may be an NPN type, and the second transistor Q2 may be a PNP type. However, this is only an example for explaining the present disclosure and is not limited to the drawings, and it will be apparent to those skilled in the art that the transistors may be implemented using other switching elements. For example, a thyristor (SCR, TRIAC, SSR, GTO), FET, IGBT, and MOSFET may be used in placed of the transistors.

Also, as described above, the ON/OFF states of the second transistor Q2 and the fourth transistor Q4 are opposite to each other. That is, when the second transistor Q2 is in the ON state, the fourth transistor Q4 is in the OFF state, and when the second transistor Q2 is in the OFF state, the fourth transistor Q4 is in the ON state. When the second transistor Q2 is in the ON state, the current is supplied to the piezoelectric element 40 from the first circuit 20 by utilizing an external high-voltage power supply as a source. When the fourth transistor Q4 is in the ON state, the residual current from the piezoelectric element 40 flows into the second circuit 30 side and exits through the ground.

Forms described may be changed or modified by those skilled in the art to which the present disclosure pertains without departing from the scope of the present disclosure, and various alterations and modifications are possible within the technical spirit of the present disclosure and the equivalent scope of the claims which will be described below.

What is claimed is:

1. A piezoelectric drive circuit which applies a voltage to a piezoelectric element, comprising:
    a first circuit which applies the voltage to the piezoelectric element and includes a first transistor having a base to which an input signal is input and an emitter which is grounded, and a second transistor having a base which is connected to a collector of the first transistor, an emitter which is connected to a high voltage source and a collector which is connected to the piezoelectric element; and
    a second circuit which removes a residual current of the piezoelectric element and includes a third transistor having a base which is connected to the base of the first transistor and an emitter which is grounded, and a fourth transistor having a base which is connected to a collector of the third transistor, a collector which is connected to the piezoelectric element and an emitter which is grounded,
    wherein the first transistor and the third transistor are simultaneously turned ON and OFF by receiving the input signal.

2. The piezoelectric drive circuit of claim 1, further comprising:
    a control unit which transmits the input signal to the first transistor and the third transistor.

3. The piezoelectric drive circuit of claim 1, wherein when the second transistor is in an ON-state, current is supplied to the piezoelectric element from the first circuit.

4. The piezoelectric drive circuit of claim 1, wherein when the fourth transistor is in an ON-state, current is introduced into the second circuit side from the piezoelectric element.

* * * * *